(12) United States Patent
Akahori et al.

(10) Patent No.: US 6,541,753 B2
(45) Date of Patent: Apr. 1, 2003

(54) SEMICONDUCTOR ENERGY DETECTOR HAVING REINFORCEMENT

(75) Inventors: Hiroshi Akahori, Hamamatsu (JP); Masaharu Muramatsu, Hamamatsu (JP); Koei Yamamoto, Hamamatsu (JP)

(73) Assignee: Hammatsu Photonics K.K., Shizuoka (JP)

( * ) Notice: Subject to any disclaimer, the term of this patent is extended or adjusted under 35 U.S.C. 154(b) by 0 days.

(21) Appl. No.: 09/845,204

(22) Filed: May 1, 2001

(65) Prior Publication Data
US 2001/0025915 A1 Oct. 4, 2001

Related U.S. Application Data

(63) Continuation-in-part of application No. PCT/JP99/06045, filed on Oct. 29, 1999.

(30) Foreign Application Priority Data
Nov. 2, 1998 (JP) ............................................. 10-312255

(51) Int. Cl.$^7$ ................................................. H01L 31/00
(52) U.S. Cl. ................................ 250/214.1; 250/208.1; 257/460; 148/33.2
(58) Field of Search ............................ 250/214.1, 208.1, 250/338.1; 257/431, 447, 460; 148/33.2, 33.4; 428/620

(56) References Cited

U.S. PATENT DOCUMENTS

| 4,675,525 A |   | 6/1987 | Amingual et al. ........... 250/338 |
| 6,033,489 A | * | 3/2000 | Marchant et al. .......... 148/33.2 |
| 6,057,539 A | * | 5/2000 | Zhou et al. .................. 250/205 |

FOREIGN PATENT DOCUMENTS

| EP | 0 858 112 | 8/1998 |
| JP | 5-121711  | 5/1993 |
| JP | 6-29506   | 2/1994 |
| JP | 6-45574   | 2/1994 |

\* cited by examiner

*Primary Examiner*—Stephone B. Allen
*Assistant Examiner*—Bradford Hill
(74) *Attorney, Agent, or Firm*—Morgan, Lewis & Bockius LLP

(57) ABSTRACT

A substrate beam 1*b* is formed so as to divide a membrane for enabling detection of an energy ray upon back illumination, there by suppressing distortion of the membrane and preventing defocus upon detection due to the distortion, or the like. The distance is set sufficiently short from each region of the membrane to a substrate frame or to the substrate beam, thereby decreasing substrate resistance and enabling high-speed reading operation.

9 Claims, 7 Drawing Sheets

SEMICONDUCTOR ENERGY DETECTOR HAVING REINFORCEMENT

RELATED APPLICATION

This is a continuation-in-part application of application serial no. PCT/JP99/06045 filed on Oct. 29, 1999, now pending.

BACKGROUND OF THE INVENTION

1. Field of the Invention

The present invention relates to a semiconductor energy detector using a charge coupled device (CCD), an active pixel sensor (APS), or the like.

2. Related Background Art

A charge coupled device (CCD) utilized as an image pickup device is a device for transferring a group of analog charges in one direction in synchronism with clock pulses, which can convert spatial information to time-series signals. However, if charges were transferred with the CCD being exposed to light, the transferred charges would mix with charges resulting from optical excitation in their respective elements, so as to cause so-called smear, thus degrading image signals. It is, therefore, common practice to use the device in time-sharing operation in division into charge storage periods for pickup of image (detection of energy ray image) and charge transfer periods for transfer of image. Practical imaging devices include, for example, frame transfer (FT) devices, full-frame transfer (FFT) devices, interline transfer (IT) devices, and so on. Among these, the FFT CCDs are mainly used for measurement. Since the FFT CCDs have no storage part and thus secure large photoreceptive part, they are high in efficiency of utilization of light and suitable for measurement of weak light.

Some semiconductor energy detectors such as the CCDs used for inspection of wafers or photomasks (reticles) or the like in the semiconductor fabrication field are required to have high sensitivity to ultraviolet light (for example, the g-line of high-pressure mercury lamp: wavelength 436 nm, the i-line of high-pressure mercury lamp: 365 nm, the XeCl excimer laser: 308 nm, the KrF excimer laser: 248 nm, the ArF excimer laser: 193 nm, etc.), because the inspection is carried out with a light source used for pattern printing exposure.

One of such image pickup devices is a back illuminated CCD (for example, Japanese Patent Application Laid-Open No. H06-29506). In a front illuminated CCD, transfer electrodes covering the photoreceptive part are, for example, electrodes of polycrystal silicon and image pickup is carried out using the front surface as a photoreceptive surface. However, since polycrystal silicon absorbs light of wavelengths not more than 400 nm, the sensitivity becomes lowered to the ultraviolet light. In contrast with it, the back illuminated CCD is the CCD whose substrate has, for example, the thickness as thin as about 10 to 30 μm and which performs image pickup by injecting energy rays into the back surface. Therefore, it permits injection and reception of light without being affected by the transfer electrodes disposed on the front surface side, thus realizing the CCD with high sensitivity even to the short-wavelength light such as the ultraviolet light.

SUMMARY OF THE INVENTION

The back illuminated CCD as described above, however, has the problem that the mechanical strength thereof is low and it is difficult to handle because of the thinness of the membrane. In addition, while it is important to assure a substrate potential, i.e., keep the substrate resistance small in MOS devices including the CCDs, it is structurally difficult to realize the small substrate resistance in the back illuminated CCD having the large membrane.

Some back illuminated CCDs as described above are reinforced by a method of enhancing the strength by structure with a substrate frame, for example, as the one described in aforementioned Japanese Patent Application Laid-Open No. H06-29506. FIG. 12 is a bottom view from the back surface side of one example of such back illuminated CCDs and FIG. 13 a cross-sectional view along arrows VI—VI thereof. The cross-sectional view used in the description shows an end face thereof. In this example a membrane 2 is formed by thinning the substrate part corresponding to the photoreceptive region in the substrate 1 and a substrate frame 1a is formed by leaving the peripheral part in a frame shape without thinning the substrate. With increase in the area of the photoreceptive part, however, there will arise the problem that it becomes harder to assure sufficient mechanical strength of the membrane 2 by only this structure and distortion occurring in each part of the membrane 2 can cause an out-of-focus state (defocus).

Each pixel of the CCD is equivalent to a MOS-FET and creates or varies a potential well for transfer of charge of the CCD by accumulating or releasing charge of the substrate in response to a clock pulse applied to a gate. However, the substrate resistance is as low as about 0.7 $\Omega/\square$ in the part of the substrate frame 1a where the thick substrate is left, whereas the substrate resistance is very high, about 100 to 1000 $\Omega/\square$, in the membrane 2 because of its thinness. For that reason, the accumulation and release of substrate charge cannot be quickly done there. Particularly, though the substrate frame 1a also has the function of assisting the accumulation and release of substrate charge while enhancing the strength, the distance to the substrate frame 1a is long near the center of the membrane 2 corresponding to the photoreceptive part and thus the substrate resistance restrains the speed of charge transfer, so as to disable high-speed operation.

The present invention has been accomplished in view of the above problems and an object of the invention is to provide a semiconductor energy detector of the back illuminated type having sufficient substrate strength and small substrate resistance.

In order to accomplish this object, a semiconductor energy detector according to the present invention is provided as a semiconductor energy detector in which a charge readout area is formed in a front surface of a semiconductor substrate, wherein in a back surface of the semiconductor substrate there are a plurality of membranes formed by thinning the semiconductor substrate and arranged to detect an energy ray, a substrate frame formed in the peripheral part of the semiconductor substrate and embracing the plurality of membranes in an inside area thereof, and at lease one substrate beam formed in a border portion between the plurality of membranes, in the inside area of the substrate frame.

The detector may also be constructed so that the charge readout area is comprised of a charge coupled device.

When the back illuminated semiconductor energy detector provided with the membrane formed including the back-surface-side area corresponding to the photoreceptive area of the charge readout area such as the CCD formed on the front surface side of the semiconductor substrate and with the substrate frame as a left part of the substrate in the peripheral region is constructed in the structure in which the area of the membrane is divided into a plurality of regions and in which the substrate beam is formed by leaving all or part of the substrate in the border portion between those regions, it can be the semiconductor energy detector that has high sensitivity to the ultraviolet light and the like and that is capable of suppressing the defocus due to distortion occurring in each region of the membrane while assuring sufficient mechanical strength of the semiconductor substrate even in such cases that the area of the photoreceptive part is large.

When the substrate beam is constructed so as to adequately decrease the distance from each region of the membrane with high substrate resistance to the substrate frame or to the substrate beam with low substrate resistance, it becomes feasible to decrease the substrate resistance and implement the high-speed operation of charge transfer or the like.

The back illuminated semiconductor energy detector as described above can also be effectively applied to detection of energy rays such as an electron beam, X-rays, etc., in addition to the light including the ultraviolet light.

The detector may be one wherein the charge readout area is constructed to have a plurality of vertical channels dividing the horizontal direction and arranged with their longitudinal direction along the vertical direction and wherein the substrate beam is placed so as to pass a region on the back surface corresponding to at least two vertical channels.

Particularly, when the charge readout area is constructed to have a plurality of vertical channels, the detector can be constructed, for example, without any vertical channel whose entire area is an insensitive area, by placing the substrate beam so as to include the part corresponding to at least two vertical channels, i.e., by placing the substrate beam so as not to be parallel to the channel direction of the vertical channels.

Further, the detector may also be one wherein areas of regions where the plurality of membranes are provided, are equal to each other in regions on the back surface corresponding to the respective vertical channels.

As a method of imaging an object moving at a constant speed, for example, such as an article mounted on a belt conveyor, there is a TDI (Time Delay and Integration) driving method for accumulating charge while transferring the charge accumulated in the photoreceptive part, at a speed corresponding to the moving speed of the object. When imaging is conducted by applying this TDI driving method to the semiconductor energy detector in the above structure wherein the areas of the regions where the membranes are provided in the respective vertical channels, are equal, the detector can be constructed as one with uniform sensitivity for charge storage and detection corresponding to each position of the object throughout the entire image to be detected and picked up.

The above-stated TDI driving method is realized by structure further comprising a charge transfer control portion for controlling the charge readout area by the TDI driving method for carrying out detection without blurring of the energy ray image of the detected object while carrying out the charge transfer at the speed corresponding to the moving speed of the detected object, for example.

DESCRIPTION OF THE PREFERRED EMBODIMENT

The preferred embodiments of the semiconductor energy detector according to the present invention will be described hereinafter in detail with reference to the drawings. In the description of the drawings the same elements will be denoted by the same reference symbols and redundant description will be omitted.

Figure 1:
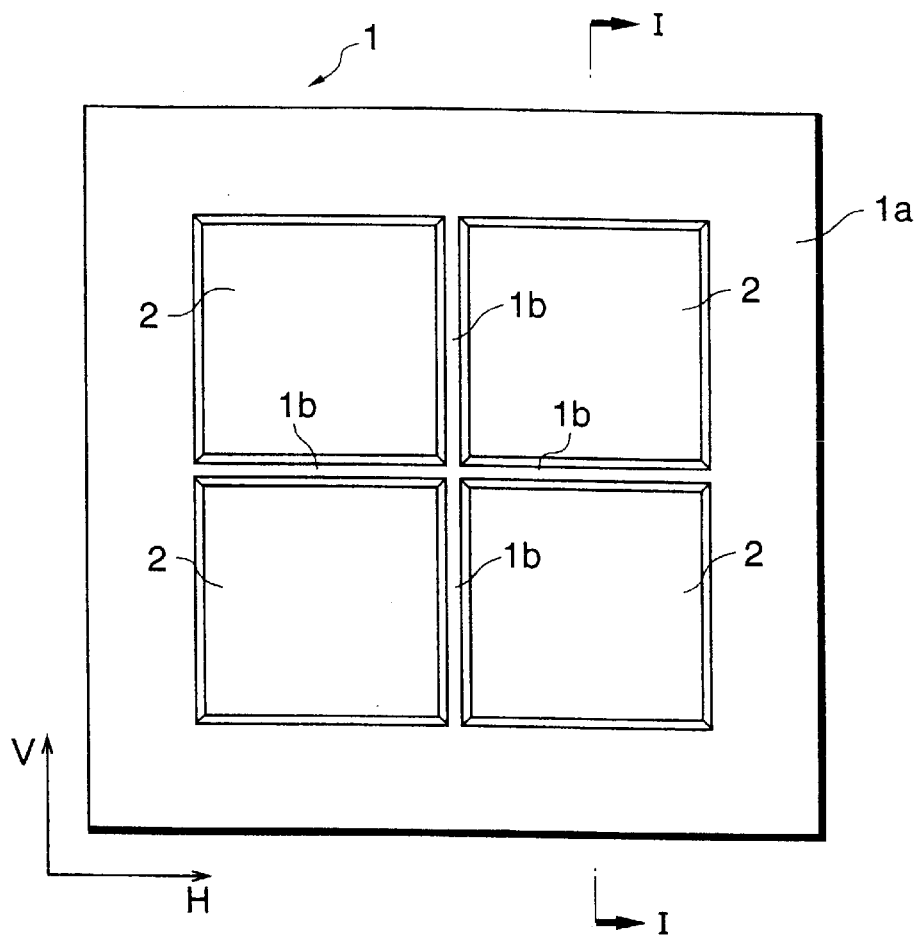
FIG. 1 is a bottom view to show the back surface side structure of the first embodiment of the semiconductor energy detector.
Figure 2:
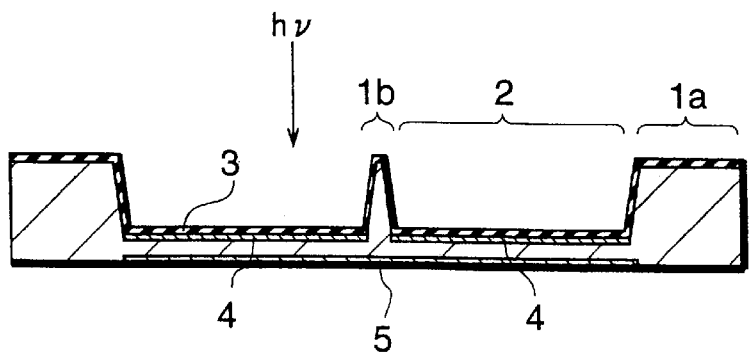
FIG. 2 is a cross-sectional view along arrows I—I of the semiconductor energy detector illustrated in FIG. 1.

FIG. 1 is a bottom view from the back surface side of the first embodiment of the semiconductor energy detector according to the present invention. FIG. 2 is a cross-sectional view along arrows I—I of the semiconductor energy detector illustrated in FIG. 1. The cross-sectional view used in the description shows an end face thereof. The vertical and horizontal charge transfer directions of the CCD formed on the front surface side are coincident with the vertical direction V and the horizontal direction H on the plane of FIG. 1. In FIG. 2 the upper side on the plane thereof is the back surface side illustrated in FIG. 1 and the lower side is the front surface side in which the CCD is formed.

The semiconductor energy detector of the present embodiment is constructed on a p-type silicon substrate 1 having the thickness of about 300 $\mu$m, the resistivity of about 10 to 100 $\Omega$·cm, and the face orientation (100). In the back illuminated semiconductor energy detector, it is necessary to effect thinning of the substrate and formation of a potential slope (accumulation layer) in the back entrance surface. The thinning of the substrate prevents electrons resulting from photoelectric conversion near the entrance surface from annihilating by recombination before diffusing to the potential wells for charge transfer and makes the distance short between the back surface of the substrate for photoelectric conversion and the front surface of the substrate for charge transfer, so as to suppress diffusion of electrons to adjacent pixels, thereby preventing degradation of resolution. On the other hand, the formation of the potential slope (accumulation layer) in the back entrance surface enables the electrons resulting from the photoelectric conversion near the entrance surface to readily diffuse to the potential wells for charge transfer. This formation of the potential slope (accumulation layer) is implemented, for example, by injection of boron ions and a thermal treatment for activation thereof.

The membrane 2 thinned to the thickness of about 10 to 30 μm (i.e., etched in the depth of about 270 to 290 μm) is formed in the back side region (inside region) including the region corresponding to the photoreceptive part, in the substrate 1. This membrane 2 is divided into four portions of an equal area (or into two portions in each of the vertical and horizontal directions), as illustrated in FIG. 1, in the present embodiment. Namely, in addition to a substrate frame 1a left in a frame shape without thinning the substrate around the membrane 2, there are substrate beams (reinforcements or ribs) 1b formed by leaving the substrate in a beam shape in the region of the membrane 2.

When the substrate 1 is constructed with the substrate beams 1b in addition to the membrane 2 and substrate frame 1a in this way, the membrane 2 permits the photoreception and imaging from the back surface and realizes the high sensitivity to the ultraviolet light and the like, while the substrate beams 1b assure the sufficient mechanical strength for the membrane 2 of the substrate 1, so as to suppress the distortion of the membrane 2, thereby preventing the defocus during image pickup. The formation of the substrate beams 1b solves the problem of high substrate resistance caused before by the long distance from the membrane 2 to the substrate frame 1a, and adequately decreases the distance from each region of the membrane 2 to the substrate frame 1a or the substrate beam 1b with low substrate resistance, thereby enabling the high-speed operation of charge transfer or the like.

At this time, the portions where the substrate beams 1b are located in the photoreceptive region become insensitive regions or low-sensitive regions. However, for example, in X-ray imaging, astronomical observation, and so on in which there are desires for increase in the photoreceptive area of the CCD, there were such cases heretofore that the increase of the area was effected by arranging a plurality of CCDs without clearance. In these applications where the existence of clearance between CCDs as a insensitive regions is not practical hindrance, there will arise no practical problem from the insensitive or low-sensitive regions of the substrate beams 1b in the semiconductor energy detector of the CCD or the like, either.

A silicon oxide film 3 serving as a protective film is formed, for example, in the thickness of about 0.1 μm, as illustrated in FIG. 2, on the back surface side of the substrate 1 and a p$^+$ high-concentration layer 4 is formed in the substrate regions corresponding to the membranes 2. The p$^+$ high-concentration layer 4 is formed, for example, in the thickness of about 0.2 μm and in the concentration of about $5 \times 10^{18}$/cm$^3$ and has the function of letting the charge resulting from the photoelectric conversion at the part near the entrance surface, diffuse toward the front surface.

On the other hand, the CCD 5 is formed on the front surface side, thereby composing the semiconductor energy detector of the back injection type. Namely, light injected from the back surface side is photoelectrically converted into charge in the region from the p$^+$ high-concentration layer 4 to the CCD 5 and the charge resulting from the photoelectric conversion diffuses toward the CCD 5, reaches the potential wells of the CCD, and is accumulated there, followed by detection and imaging.

This structure with the membrane 2 is made in an intermediate step of the wafer process of the CCD. It is formed by first depositing a silicon nitride film on the silicon substrate 1, patterning it in the desired shape by a photolithography step, and then etching the silicon substrate 1 with an etchant of KOH, using the patterned silicon nitride film as a mask, so as to leave chip surrounding portions covered with the silicon nitride film as they are thick.

Figure 3:
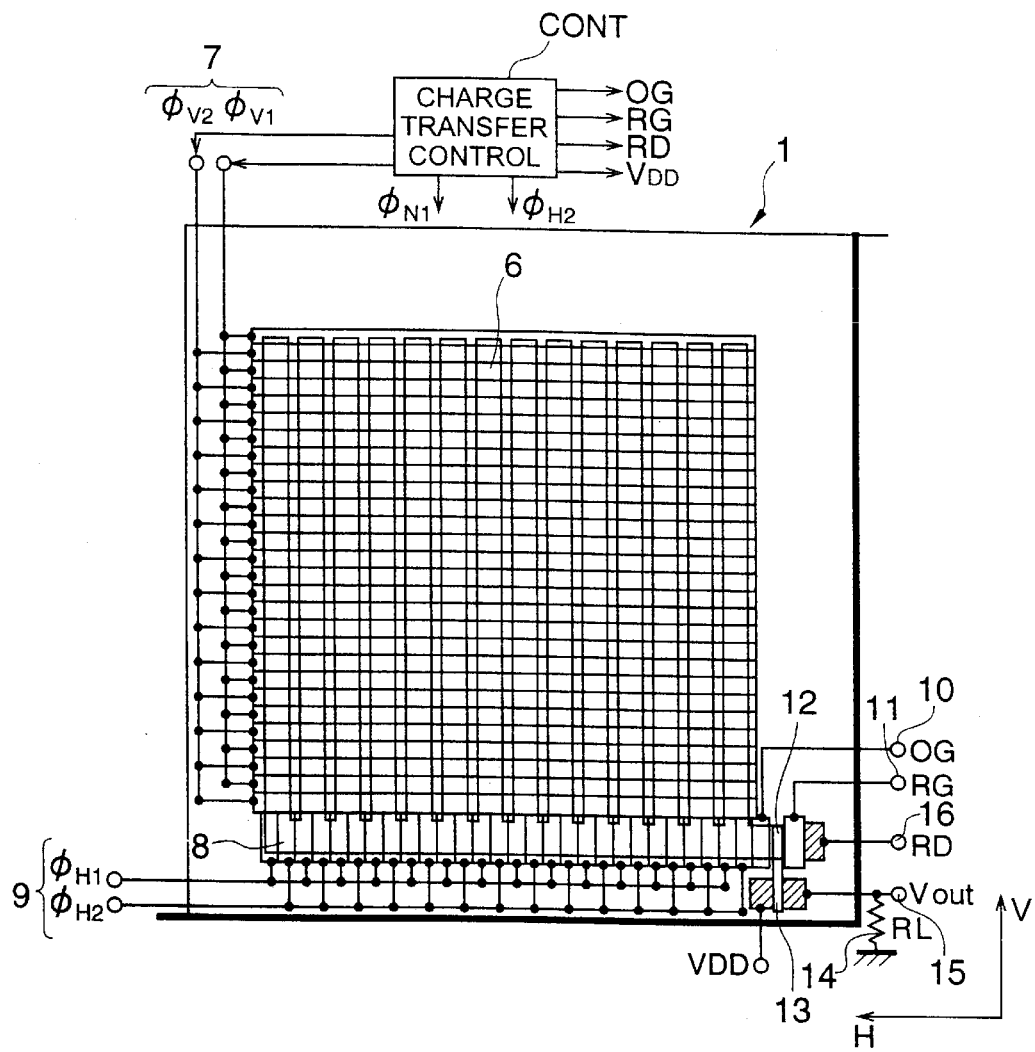
FIG. 3 is a top plan view to show the front surface side structure of the semiconductor energy detector illustrated in FIG. 1.

FIG. 3 is a top plan view from the front surface side of the semiconductor energy detector illustrated in FIG. 1 and in the present embodiment the FFT CCD (for example, comprising pixels of approximately 20 μm×20 μm two-dimensionally arranged in the array of 512 or 1024 columns horizontal and 128 or 256 rows vertical) is constructed therein. The structure of the CCD on the front surface side as described above is substantially the same as that of the well-known CCDs. In the other embodiments described hereinafter the front-surface-side structure is substantially the same as that of the present embodiment except for the shapes, areas, etc. of the substrate and the photoreceptive surface, but it is noted that the front-surface-side structure is by no means limited to this FFT CCD. The semiconductor energy detector can also be constructed using the CCD of another form, another device except for the CCD, or another element.

On the front surface of the substrate 1 there are an array of plural columns (for example, 512 or 1024 columns each in the width of about 20 μm)of vertical transfer channels 6 whose transfer direction of charge is along the vertical direction, and a vertical shift register is formed of a vertical transfer electrode group 7 consisting of a plurality of vertical transfer electrodes whose longitudinal direction is along the direction perpendicular to the array of the transfer channels. Each of the arrayed vertical transfer channels 6 is connected to a horizontal transfer channel 8 (for example, of the width of about 25 to 100 μm) and a horizontal shift register is constructed of a horizontal transfer electrode group 9 consisting of a plurality of horizontal transfer electrodes perpendicular to the transfer channel 8. The vertical transfer electrode group 7 is divided into two regions upper and lower in the case of the FT CCD, in which a photoreceptive portion (upper region) and a storage portion (lower region) are formed, respectively.

Charges stored in the potential wells by photoreception and imaging during a charge storage period are sequentially transferred during a charge transfer period by the vertical shift register having the vertical transfer channels 6 and the vertical transfer electrode group 7 and by the horizontal shift register having the horizontal transfer channels 8 and the horizontal transfer electrode group 9, to become time-series signals. Each transferred charge passes under an output gate 10 of a fixed potential and is fed into a potential well of floating diode 12 kept at a fixed potential by a reset gate 11 to change the potential of the floating diode 12. This potential change is read through a source-follower circuit composed of an on-chip FET 13 and an external load resistor 14, and image output is gained through an output terminal 15. After that, the charge fed into the floating diode 12 passes under the reset gate 11 to be discharged through a reset drain 16.

As described above, the above-stated semiconductor energy detector is the one provided with the semiconductor substrate 1 in which the thickness of the inside region 2 is smaller than the thickness of the peripheral part 1a, and the charge readout area 5 formed on the front surface side of the semiconductor substrate 1 in order to read the charge generated in the semiconductor substrate 1 according to incidence of the energy ray hv (see FIG. 2) from the back surface side of the semiconductor substrate 1, wherein at least one reinforcement 1b is provided in the inside region 2.

In the above semiconductor energy detector, the reinforcement 1b is integrally formed with the semiconductor substrate 1, the semiconductor substrate 1 and reinforcement 1b are comprised of silicon, the ends of the reinforcement 1b are connected to the peripheral part 1a of the semiconductor substrate 1, the charge readout area 5 is comprised of the charge coupled device (CCD), and the charge readout area 5 has the plurality of transfer channels 6 for transfer of the charge generated.

Here each transfer channel 6 extends along the vertical direction and, with reference to FIG. 1, it is perpendicular to the substrate beam 1b extending in the horizontal direction. The beam 1b extending in the vertical direction is superposed over one of the transfer channels 6 across the entire region and this superposed part makes a shadow on an image when a still detection object is imaged. Thus only the structure of the reinforcement 1b on the back surface side was modified without changing the structure on the front surface side. The second and third embodiments below show examples of such modification and it is noted that the portions without specific description are the same as those in the first embodiment described above.

Figure 4:
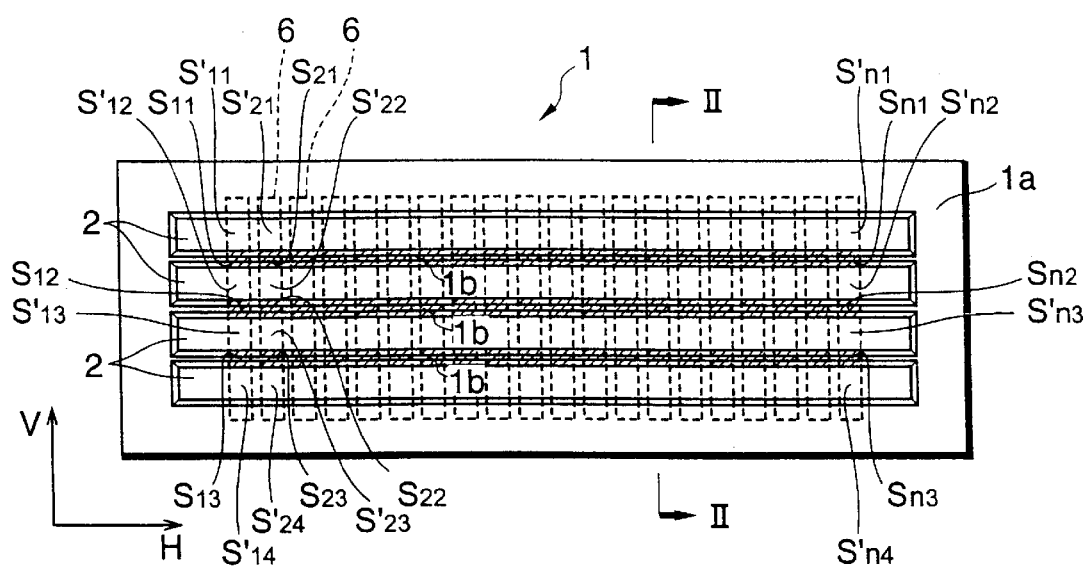
FIG. 4 is a bottom view to show the back surface side structure of the second embodiment of the semiconductor energy detector.
Figure 5:
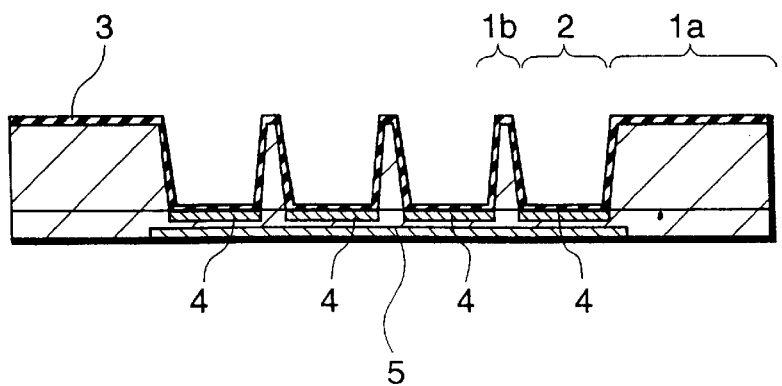
FIG. 5 is a cross-sectional view along arrows II—II of the semiconductor energy detector illustrated in FIG. 4.

FIG. 4 is a bottom view from the back surface side of the second embodiment of the semiconductor energy detector. In the present embodiment the size of the semiconductor substrate 1 is illustrated in dimensions different from those described above on the drawing for convenience' sake of description. FIG. 5 is a cross-sectional view along arrows II—II of the semiconductor energy detector illustrated in FIG. 4. The vertical direction V and the horizontal direction H etc. on the drawings are the same as in FIG. 1 and FIG. 2. The present embodiment is substantially the same in the thickness of the substrate, the thickness of the membrane (etching depth), the cross-sectional structure thereof, and so on as the first embodiment.

In the present embodiment the membrane 2 is divided into four portions (or quartered in the vertical direction) having their longitudinal direction along the horizontal direction H, i.e., along the direction perpendicular to the charge transfer direction of the vertical shift register and having an equal area, by the substrate beams 1b. Each reinforcement 1b is provided so as to cross at least either two of the transfer channels 6, i.e., the reinforcements 1b are placed in parallel to each other relative to the transfer channels 6 extending in the vertical direction, so as to prevent either reinforcement from being superposed over a transfer channel across the entire region.

In this configuration, the substrate beams 1b are located so that areas of regions of the membranes 2 become equal to each other relative to the back-surface-side regions corresponding to the respective vertical transfer channels 6 of the vertical columns formed on the front surface side, whereby it becomes feasible to achieve the effects of assuring the sufficient mechanical strength and others as in the first embodiment and implement imaging without the problem of the insensitive or low-sensitive regions due to the substrate beams 1b in the application of the TDI (Time Delay and Integration) driving method.

In other words, in the present detector, the total areas in the respective transfer channels 6 of the regions $S_{11}$, $S_{12}$, $S_{13}$; $S_{21}$, $S_{22}$, $S_{23}$; . . . $S_{mn}$ of the reinforcements 1b overlapping with the respective transfer channels 6 in a view from the front surface side of the semiconductor substrate 1, are equal to each other ($S_{TOTAL} = S_{11} + S_{12} + S_{13} = S_{21} + S_{22} + S_{23} = \ldots = S_{n1} + S_{n2} + S_{n3}$) (where n is the number of transfer channels).

Describing it in more detail, the total areas of the areas of the membranes 2 overlapping with the respective transfer channels 6 when seen from the front surface side of the semiconductor substrate 1, are equal to each other ($S'_{TOTAL} = S_{11}' + S_{12}' + S_{13}' + S_{14}' = S_{21}' + S_{22}' + S_{23}' + S_{24}' = \ldots S_{n1}' + S_{n2}' + S_{n3}' + S_{n4}'$).

In other words, area ratios in the respective channels 6 between the reinforcements 1b and the overlapping regions of the membranes 2 with each channel 6, are equal to each other ($S_{TOTAL}$ (first column)/$S'_{TOTAL}$ (first column)=$S_{TOTAL}$ (second column)/$S'_{TOTAL}$ (second column)=...=$S_{TOTAL}$ (nth column)/$S'_{TOTAL}$ (nth column)).

This area setting is effective in the TDI driving method.

The TDI driving method is an imaging method used for imaging an article as an imaged object moving at a constant speed, for example, such as an article present on a belt conveyor, and method in which the moving direction of the imaged object is set in agreement with the charge transfer direction of the vertical shift register and in which accumulation of charges and imaging is conducted with transferring charges stored in the respective potential wells of the photoreceptive part at a speed corresponding to a moving speed of the imaged object. According to this method, a specific stored charge always corresponds to a specific position of the imaged object, regardless of the movement of the imaged object, which permits imaging without smear nor blurring.

By setting the substrate beams 1b so as to equate the areas of the regions where the membranes 2 are located, against the respective vertical transfer channels 6 as described above, it becomes feasible to equate periods and ratios of passage through the insensitive or low-sensitive regions due to the substrate beams 1b, of the respective stored charges transferred in the vertical transfer channels 6 in the TDI driving method (or to equate exposure times during periods of charge transfer from one end to the other end of the vertical transfer channels 6), so as to uniformize the imaging sensitivity throughout the entire image to be picked up.

In practice, the TDI driving method as described is realized, for example, by providing the CCD illustrated in FIG. 3, with a charge transfer control CONT for controlling the charge transfer according to the TDI driving method by controlling the voltages or the like applied to the transfer electrodes of the vertical transfer electrode group 7 and the horizontal transfer electrode group 9.

In other words, the above semiconductor energy detector is further provided with the charge transfer control CONT (see FIG. 3) for controlling the charge readout area so as to make the transfer channels perform the charge transfer at the speed corresponding to the moving speed of the detected object.

Figure 6:
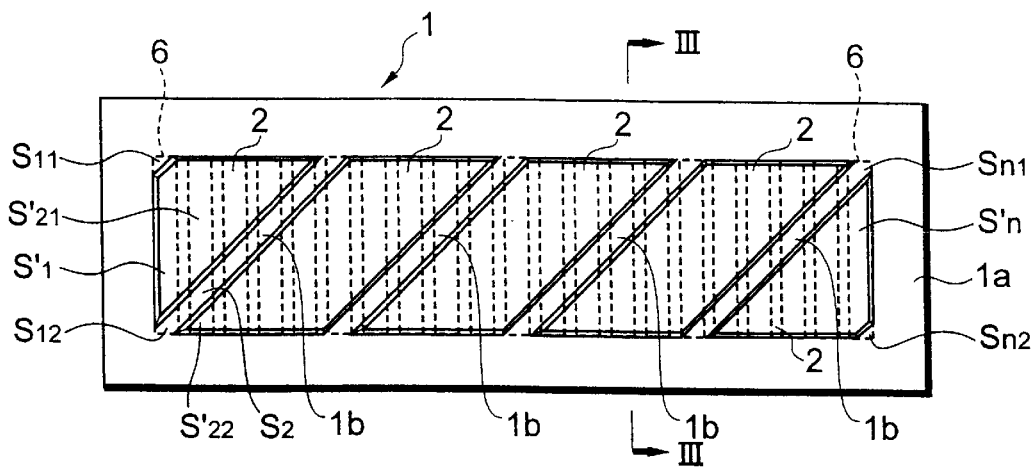
FIG. 6 is a bottom view to show the back surface side structure of the third embodiment of the semiconductor energy detector.
Figure 7:
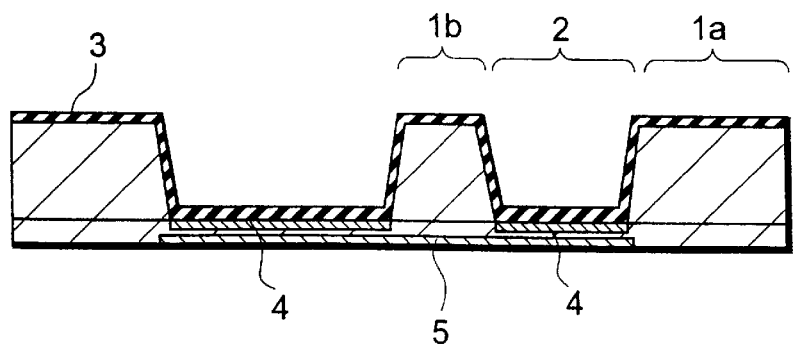
FIG. 7 is a cross-sectional view along arrows III—III of the semiconductor energy detector illustrated in FIG. 6.

FIG. 6 is a bottom view from the back surface side of the third embodiment of the semiconductor energy detector. FIG. 7 is a cross-sectional view along arrows III—III of the semiconductor energy detector illustrated in FIG. 6. The vertical and horizontal directions etc. on the drawings are the same as in FIG. 1 and FIG. 2. The present embodiment is also substantially the same in the thickness of the substrate, the thickness of the membrane (etching depth), the cross-sectional structure thereof, and soon as the first or second embodiment .

The present embodiment is similar to the second embodiment, but the membranes 2 and substrate beams 1b are obliquely formed right upward at the angle of 45° to the vertical transfer channels 6. This shape permits the semiconductor energy detector to be constructed with much higher mechanical strength thereof and with less defocus due to distortion of the membranes 2 as compared with the second embodiment.

In the present embodiment, the substrate beams 1b are also arranged and constructed so as to equate the areas of the regions where the membranes 2 are provided, in the respective vertical transfer channels 6 by matching horizontal positions of upper ends (border ends to the upper part of the substrate frame 1a) and lower ends (border ends to the lower part of the substrate frame 1a) of the substrate beams 1b with each other as illustrated in FIG. 6. Namely, the following relations hold in FIG. 6; $(S_{TOTAL}=S_{11}+S_{12}=S_2=\ldots=S_{n1}+S_{n2})$, $(S'_{TOTAL}=S_1'=S_{21}'+S_{22}'=\ldots=S_n')$, $(S_{TOTAL}$ (first column)$/S'_{TOTAL}$ (first column)$=S_{TOTAL}$ (second column)$/S'_{TOTAL}$ (second column)$=\ldots=S_{TOTAL}$ (nth column)$/S'_{TOTAL}$ (nth column)).

Accordingly, the present embodiment also permits the imaging without the problem of the insensitive or low-sensitive regions due to the substrate beams 1b in the application of the TDI driving method, similarly as in the second embodiment.

The semiconductor energy detectors according to the present invention are not limited to the above embodiments, but they can also be realized in various forms.

Figure 8:
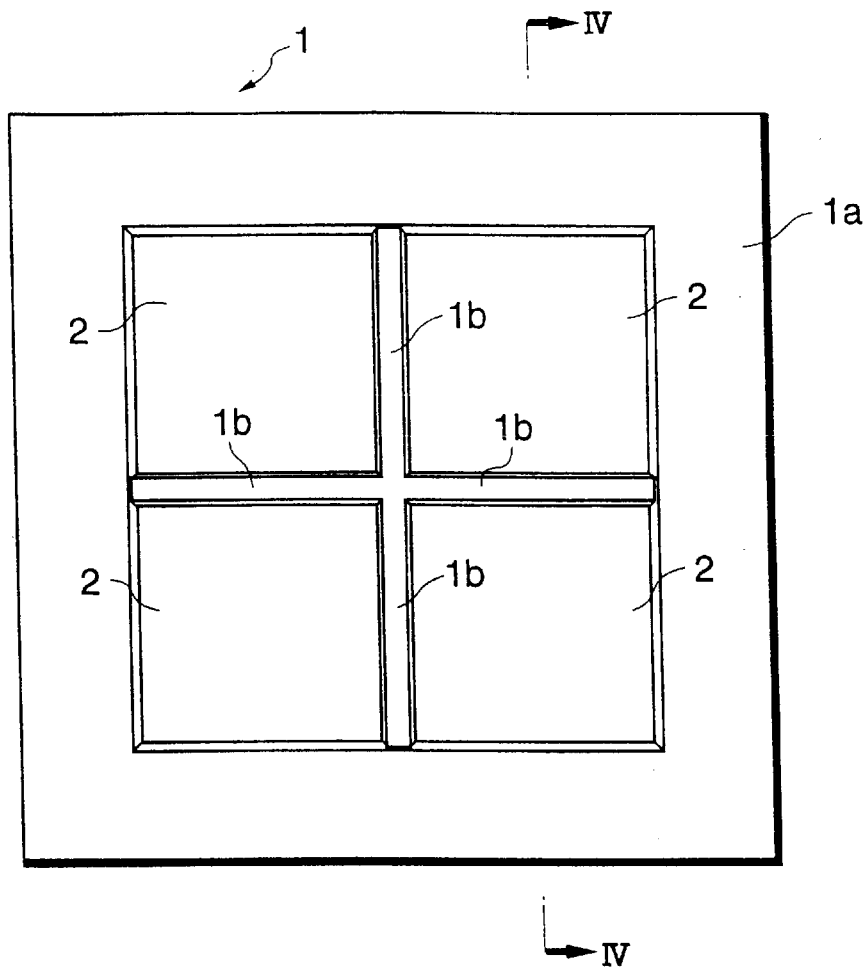
FIG. 8 is a bottom view to show the back surface side structure of the fourth embodiment of the semiconductor energy detector.
Figure 9:
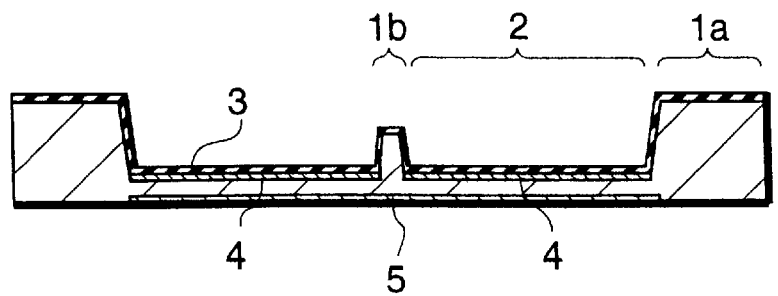
FIG. 9 is a cross-sectional view along arrows IV—IV of the semiconductor energy detector illustrated in FIG. 8.

FIG. 8 is a bottom view from the back surface side of the fourth embodiment of the semiconductor energy detector. The structure without specific description is the same as in the above embodiments. FIG. 9 is a cross-sectional view along arrows IV—IV of the semiconductor energy detector illustrated in FIG. 8. In the first to third embodiments the heights (thicknesses) of the substrate frame 1a and substrate beams 1b are set all equal, whereas in the present embodiment the substrate beams 1b have the height (thickness) lower (thinner) than the substrate frame 1a. This configuration can be realized by carrying out two separate steps of silicon etching, and reduce the possibility of producing a shadow in the image from the imaged object.

Figure 10:
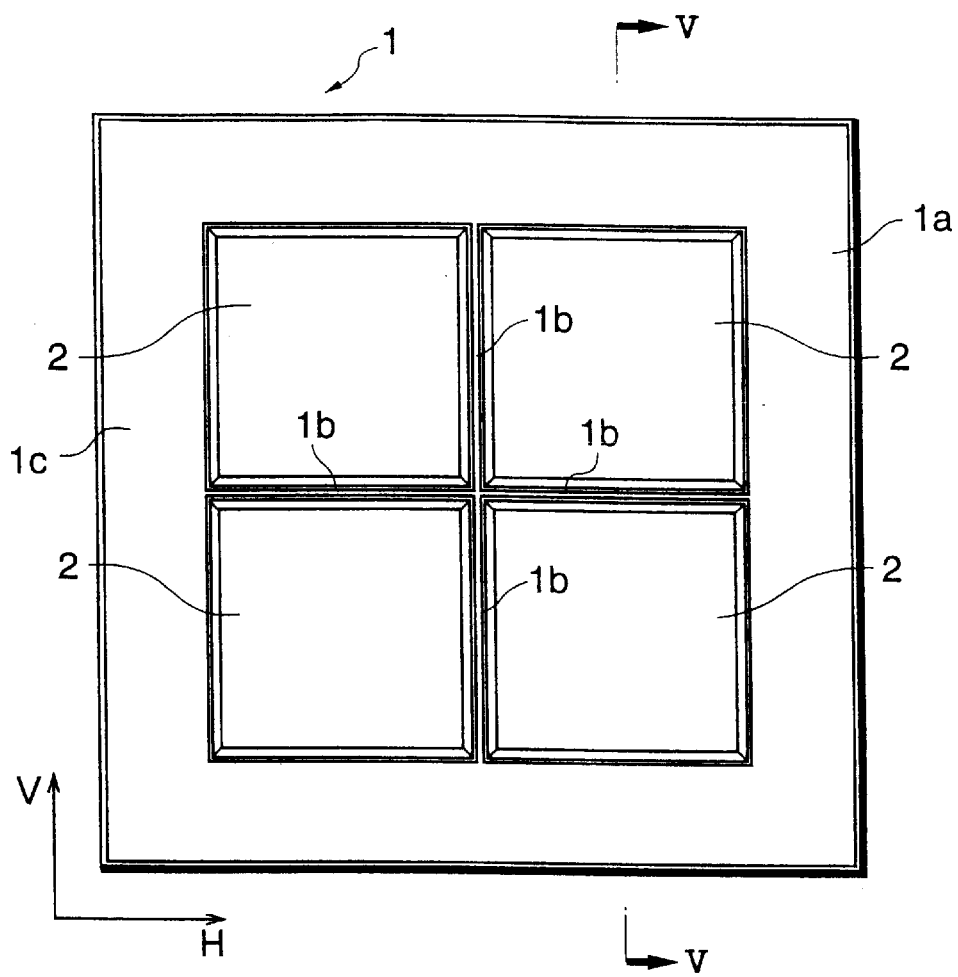
FIG. 10 is a bottom view to show the back surface side structure of the fifth embodiment of the semiconductor energy detector.
Figure 11:
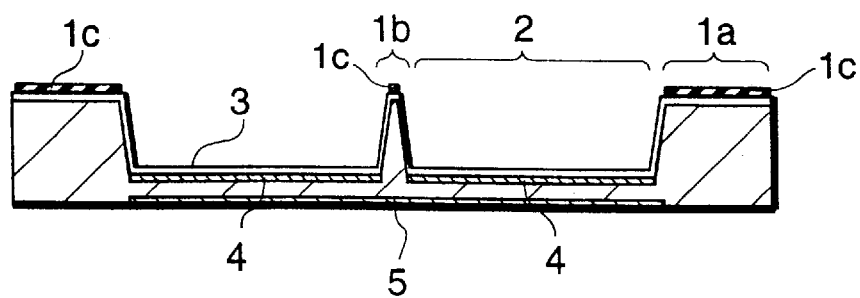
FIG. 11 is a cross-sectional view along arrows V—V of the semiconductor energy detector illustrated in FIG. 10.
Figure 12:
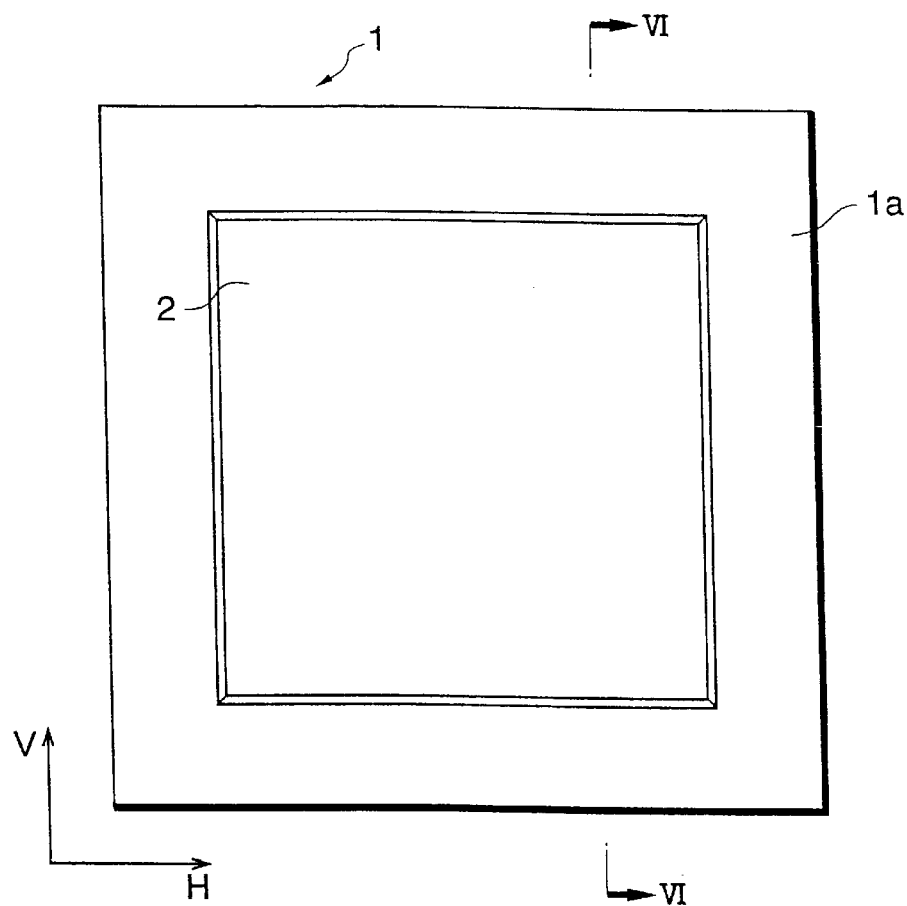
FIG. 12 is a bottom view to show the back surface side structure of an example of the conventional back illuminated CCD.
Figure 13:
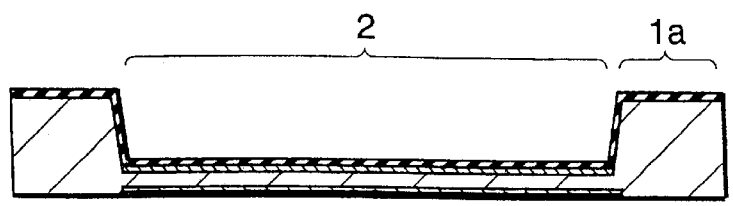
FIG. 13 is a cross-sectional view along arrows VI—VI of the back illuminated CCD illustrated in FIG. 12.

FIG. 10 is a bottom view from the back surface side of the fifth embodiment of the semiconductor energy detector. The structure without specific description is the same as in the above embodiments. FIG. 11 is a cross-sectional view along arrows V—V of the semiconductor energy detector illustrated in FIG. 10. In the present embodiment, the back-entrance-side regions of the substrate frame 1a and substrate beams 1b are metallized by mask evaporation to form a metal layer 1c. This can further reduce the substrate resistance. For example, when the substrate beams 1b are formed in the slightly lower height as illustrated in FIG. 8 and FIG. 9, the substrate resistance becomes slightly higher in this part, and the formation of the metal layer 1c by the metallization is particularly effective in such cases.

As detailed above, the above semiconductor energy detectors of the CCDs or the like present the following effects. Specifically, when the semiconductor energy detector with the charge readout area formed on the front surface side is constructed in the form of the back illuminated semiconductor energy detector provided with the membrane of the thinned substrate on the back surface side and with the high sensitivity to the electron beam, X-rays, ultraviolet light, and so on and when the substrate beams are further provided so as to divide the membrane, in addition to the substrate frame around the membrane, it becomes feasible to enhance the mechanical strength of the substrate and reduce the defocus due to distortion of the membrane. The substrate resistance in each region of the membrane is reduced by adequately decreasing the distance to the substrate frame or to the substrate beam, thereby realizing reduction of the reading time by the high-speed operation of charge transfer.

Further, particularly, when such substrate beams are constructed so as to equate their covering areas over the respective vertical transfer channels, the semiconductor energy detector can be realized so that, in detection of the energy ray such as the ultraviolet light by the TDI driving method, passing times can be equated for the respective stored charges to pass through the insensitive or low-sensitive regions due to the substrate beams, so as to permit the detection and imaging etc. with uniform detection sensitivity at every detection point.

What is claimed is:

1. A semiconductor energy detector comprising a semiconductor substrate having an inside region and a peripheral part, said inside region having a thickness which is smaller than that of the peripheral part, and having a charge readout area formed on a front surface side of said semiconductor substrate in order to read a charge generated in said semiconductor substrate according to incidence of an energy ray from a back surface side of the semiconductor substrate, wherein one or more reinforcements are provided in said inside region;

wherein an array of vertical transfer channels for generated charges is provided on the front surface side of said semiconductor substrate, the charges in the transfer channel extending to said readout area; and wherein each of said transfer channels extends across at least one of said reinforcements.

2. A semiconductor energy detector according to claim 1, wherein each reinforcement is integrally formed with said semiconductor substrate.

3. A semiconductor energy detector according to claim 2, wherein said semiconductor substrate and each reinforcement are comprised of silicon.

4. A semiconductor energy detector according to claim 1, wherein ends of each reinforcement are connected to the peripheral part of said semiconductor substrate.

5. A semiconductor energy detector according to claim 1, wherein said charge readout area is comprised of a charge coupled device.

6. A semiconductor energy detector according to claim 1, wherein said charge readout area has a plurality of transfer channels for transfer of the charge generated.

7. A semiconductor energy detector according to claim 6, wherein when said detector is viewed in a two dimensional plane view, said reinforcement intersects and extends across at least two of said transfer channels.

8. A semiconductor energy detector according to claim 7, wherein when said detector is viewed in a two dimensional plane view, an area is defined by the intersection of said reinforcement and one of said transfer channels and the total area of all the area defined by the intersection of a representative transfer channel and all the reinforcements intersected in said representative transfer channel is equal to a total area of any one of the remaining transfer channels and the corresponding intersections with said reinforcements.

9. A semiconductor energy detector according to claim 6, further comprising a charge transfer control portion for controlling said charge readout area so as to make said transfer channels perform the charge transfer at a speed corresponding to a moving speed of a detection object.

\* \* \* \* \*